US009023722B2

(12) United States Patent
Evans et al.

(10) Patent No.: US 9,023,722 B2
(45) Date of Patent: May 5, 2015

(54) COMPOUND SEMICONDUCTOR GROWTH USING ION IMPLANTATION

(75) Inventors: Morgan D. Evans, Manchester, MA (US); Simon Ruffell, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 232 days.

(21) Appl. No.: 13/470,015

(22) Filed: May 11, 2012

(65) Prior Publication Data
US 2012/0289031 A1 Nov. 15, 2012

Related U.S. Application Data

(60) Provisional application No. 61/486,032, filed on May 13, 2011.

(51) Int. Cl.
H01L 21/265 (2006.01)
H01L 21/266 (2006.01)
H01L 21/02 (2006.01)
H01L 21/223 (2006.01)
H01L 29/267 (2006.01)

(52) U.S. Cl.
CPC ...... *H01L 21/0242* (2013.01); *H01L 21/02381* (2013.01); *H01L 21/0254* (2013.01); *H01L 21/02639* (2013.01); *H01L 21/02647* (2013.01); *H01L 21/2236* (2013.01); *H01L 21/265* (2013.01); *H01L 21/26506* (2013.01); *H01L 21/266* (2013.01); *H01L 29/267* (2013.01)

(58) Field of Classification Search
USPC .......................................... 438/369, 499, 505
See application file for complete search history.

(56) References Cited

U.S. PATENT DOCUMENTS

| 6,168,962 | B1 * | 1/2001 | Itoh et al. ................... 438/22 |
| 7,816,764 | B2 * | 10/2010 | Marchand et al. ........... 257/613 |
| 8,187,979 | B2 * | 5/2012 | Ramappa et al. ............ 438/710 |
| 8,368,036 | B2 * | 2/2013 | Hino ...................... 250/492.21 |
| 2005/0263854 | A1 * | 12/2005 | Shelton et al. ............... 257/615 |
| 2006/0258128 | A1 * | 11/2006 | Nunan et al. ................ 438/510 |
| 2007/0155028 | A1 * | 7/2007 | Jang et al. .................... 438/14 |
| 2008/0149856 | A1 * | 6/2008 | Low ......................... 250/492.21 |
| 2008/0166822 | A1 * | 7/2008 | Niwayama et al. ............... 438/7 |
| 2009/0108297 | A1 * | 4/2009 | Sato et al. .................... 257/192 |
| 2009/0139449 | A1 * | 6/2009 | Suguro et al. ................ 118/504 |
| 2009/0155989 | A1 * | 6/2009 | Uematsu et al. ............. 438/507 |
| 2009/0215248 | A1 * | 8/2009 | Nakahata et al. ............ 438/481 |
| 2009/0317937 | A1 * | 12/2009 | Gupta et al. ................... 438/80 |

(Continued)

FOREIGN PATENT DOCUMENTS

JP 2006339534 A * 12/2006

OTHER PUBLICATIONS

Choi et al., Effect of Patterned Ion-Implanted Sapphire on Ultraviolet Light-Emitting Diodes, Japanese Journal of Applied Physics, vol. 47, No. 11, 2008, pp. 8265-8268.*

(Continued)

*Primary Examiner* — Earl Taylor

(57) ABSTRACT

A workpiece is implanted to affect growth of a compound semiconductor, such as GaN. Implanted regions of a workpiece increase, reduce, or prevent growth of this compound semiconductor. Combinations of implants may be performed to cause increased growth in certain regions of the workpiece, such as between regions where growth is reduced. Growth also may be reduced or prevented at the periphery of the workpiece.

19 Claims, 12 Drawing Sheets

(56) References Cited

U.S. PATENT DOCUMENTS

| | | | |
|---|---|---|---|
| 2010/0065865 A1* | 3/2010 | Byun et al. | 257/94 |
| 2010/0093113 A1* | 4/2010 | Niwayama et al. | 438/10 |
| 2010/0308236 A1* | 12/2010 | Carlson et al. | 250/492.3 |
| 2010/0314559 A1* | 12/2010 | Vopat et al. | 250/492.3 |
| 2010/0323508 A1* | 12/2010 | Adibi et al. | 438/513 |
| 2010/0330787 A1* | 12/2010 | Sferlazzo | 438/514 |
| 2011/0039403 A1* | 2/2011 | Sohn et al. | 438/525 |
| 2011/0108742 A1* | 5/2011 | Weaver et al. | 250/492.21 |
| 2011/0143527 A1* | 6/2011 | Platow et al. | 438/515 |
| 2011/0256698 A1* | 10/2011 | Riordon et al. | 438/529 |
| 2011/0259408 A1* | 10/2011 | Ramappa et al. | 136/255 |
| 2012/0286285 A1* | 11/2012 | Godet et al. | 257/76 |
| 2012/0289031 A1* | 11/2012 | Evans et al. | 438/478 |

OTHER PUBLICATIONS

Cho et al., Implantation of N ions on Sapphire Substrate for Improvement of GaN Epilayer, Japanese Journal of Applied Physics, vol. 41, 2002, pp. 4267-4270.*

Koh et al., The Effect of N+ -Implanted Si(111) Substrate and Buffer Layer on GaN Films, Journal of Crystal Growth, 218, 2000, pp. 214-220.*

Jamil et al., Development of Strain Reduced GaN on Si(111) by Substrate Engineering, Applied Physics Letters, 87, 082103, 2005, 3 pages.*

Definitions of the term "periphery".*

Definitions of the term grid .*

Kim et al., Epitaxial Lateral Overgrowth of GaN on Sapphire Substrate Using High-Dose N+-Ion-Implantation, Journal of The Electrochemical Society, 157, 12, 2010, pp. H1132-H1134.*

Definitions of the term "periphery", date accessed online Sep. 16, 2014.*

Definitions of the term "grid", date accessed online Sep. 16, 2014.*

Kim, Bumjoon, et al., Epitaxial Lateral Overgrowth of GaN on Si (111) Substrates Using High-Dose, N{+} Ion Implantation, Chemical Vapor Deposition, 2010, pp. 80-84, vol. 16, Nos. 1-3, Wiley-Vch, Weinheim, Germany.

* cited by examiner

COMPOUND SEMICONDUCTOR GROWTH USING ION IMPLANTATION

CROSS-REFERENCE TO RELATED APPLICATIONS

This claims priority to the provisional patent application entitled "Improved Epitaxial Growth," filed May 13, 2011 and assigned U.S. App. No. 61/486,032, the disclosure of which is hereby incorporated by reference.

FIELD

This invention relates to ion implantation and, more particularly, to ion implantation to improve the quality of a layer grown on a workpiece.

BACKGROUND

Ion implantation is a standard technique for introducing material into a workpiece. A desired implant material is ionized in an ion source, the ions are accelerated to form an ion beam of prescribed energy, and the ion beam is directed at the surface of the workpiece. The energetic ions in the ion beam penetrate into the bulk of the workpiece material and affect both the surface and depth of the workpiece material under certain conditions.

Gallium nitride (GaN) is a material commonly grown on workpieces. GaN is becoming more important for use in light-emitting diodes (LEDs), power transistors, and solid state lasers. The ability to grow high-quality GaN is one limiting factor to improving the quality and lowering the cost of these devices. One method of improving the quality of epitaxially-grown GaN is known as epitaxial layer overgrowth (ELOG). For ELOG, a layer of GaN is grown, hard mask windows of $SiO_2$ or $Si_xN_y$ are deposited, and then the high-quality GaN is grown. In some instances, deposition of the hard mask requires removal of the workpiece from the MOCVD tool and then reintroduction of the workpiece to the MOCVD tool after a lithography step, photoresist application, deposition, and photoresist removal. This particular process is cumbersome and costly. Repeated ELOG sequences add even more cost.

FLOG of GaN on silicon, sapphire, SiC, AlN, GaN, or other workpieces can be accomplished using implantation instead of $SiO_2$ or $Si_xN_y$ deposition. Previously, photoresist was used to mask part of the silicon workpiece and implantation was performed on the unmasked areas. GaN grew laterally over the implanted areas. However, this process is still fairly complex. The use of photoresist adds extra steps, which increases manufacturing costs. What is needed is a faster, less complex, and lower cost method of growing high-quality compound semiconductor layers.

SUMMARY

According to a first aspect of the invention, a method of workpiece processing is provided. The method comprises implanting a first plurality of implanted regions in a workpiece with a first species. A compound semiconductor is grown on the workpiece after the implanting. The compound semiconductor growth is reduced on the first plurality of implanted regions compared to between the first plurality of implanted regions. At least one device is formed between the first plurality of implanted regions.

According to a second aspect of the invention, a method of workpiece processing is provided. The method comprises implanting a second plurality of regions in a workpiece. A compound semiconductor is grown on the workpiece after the implanting. The compound semiconductor growth is increased on the plurality of implanted regions compared to between the plurality of implanted regions.

According to a third aspect of the invention, a method of workpiece processing is provided. The method comprises implanting a periphery of a workpiece. A compound semiconductor is grown on the workpiece after the implanting. The growth is reduced on the periphery.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with formation of a compound semiconductor such as GaN, but these embodiments also may be used with other III/V compound semiconductors, II/VI compound semiconductors, or other materials known to a person skilled in the art. While specific types of implanters are disclosed, other ion implantation systems known to those skilled in the art that can focus an ion beam or that can implant particular regions of a workpiece with or without a mask on the workpiece may be used in the embodiments described herein. While LEDs are specifically disclosed, other devices also may benefit from the embodiments described herein. The workpieces herein may be silicon, sapphire, AlN, GaN, other compound semiconductors, or other materials and include a coating or other layers in some instances. Any implant dimensions are exemplary and other dimensions are possible. Thus, the invention is not limited to the specific embodiments described below.

Figure 1:
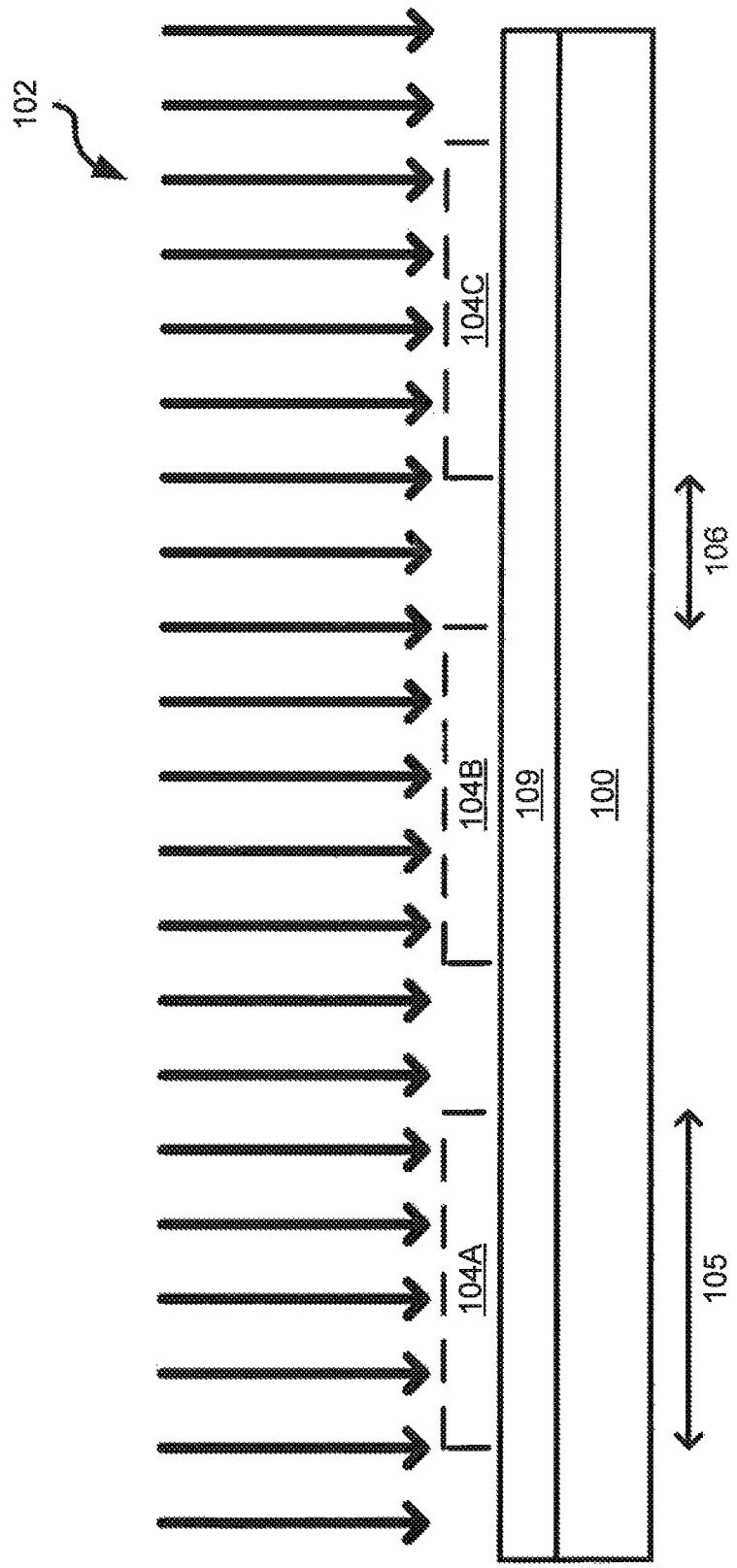
FIG. 1 is a cross-sectional side view of a first embodiment of implantation into a workpiece.

FIG. 1 is a cross-sectional side view of a first embodiment of implantation into a workpiece. In this embodiment, a blanket implant is performed over the entire surface of the workpiece 100 using the ions 102 (illustrated by the arrows). The implanted region 109 is formed in the workpiece 100. The devices 104A-104C, which may be GaN or some other compound semiconductor, are then grown on top of this workpiece 100 after the implantation is completed. The devices 104A-104C are shown with dotted lines in FIG. 1 because these devices 104A-104C were not formed prior to the blanket implant. These devices 104A-104C may have a width 105 of approximately 300 µm in one embodiment, though these devices 104A-104C may be between 100 µm to 3000 µm in dimension. Of course, other dimensions are possible. A distance 106 of approximately 100 µm may separate each pair of devices 104A-104C in one instance. The distance 106 also may be between 10 µm to 300 µm or other distances known to those skilled in the art.

The blanket implant that forms the implanted region 109 improves compound semiconductor growth, such as the growth of GaN. This blanket implant can be combined with a selective or patterned implant, as seen separately in other embodiments herein. The blanket implant and patterned implants can be performed in either order. One possible mechanism that causes the improved growth is that the implant changes the stoichiometry on the surface of the workpiece 100 or relieves the lattice mismatch between the workpiece 100 and the compound semiconductor. Stoichiometry is changed by either adding particular elements through implantation or by preferential sputtering of the elements from the workpiece. For example, preferentially sputtering Al or O in a sapphire workpiece 100, depending on implant species, energy, angle, and dose, may affect the stoichiometry of the workpiece 100. Of course, other mechanisms are possible.

Figure 2:
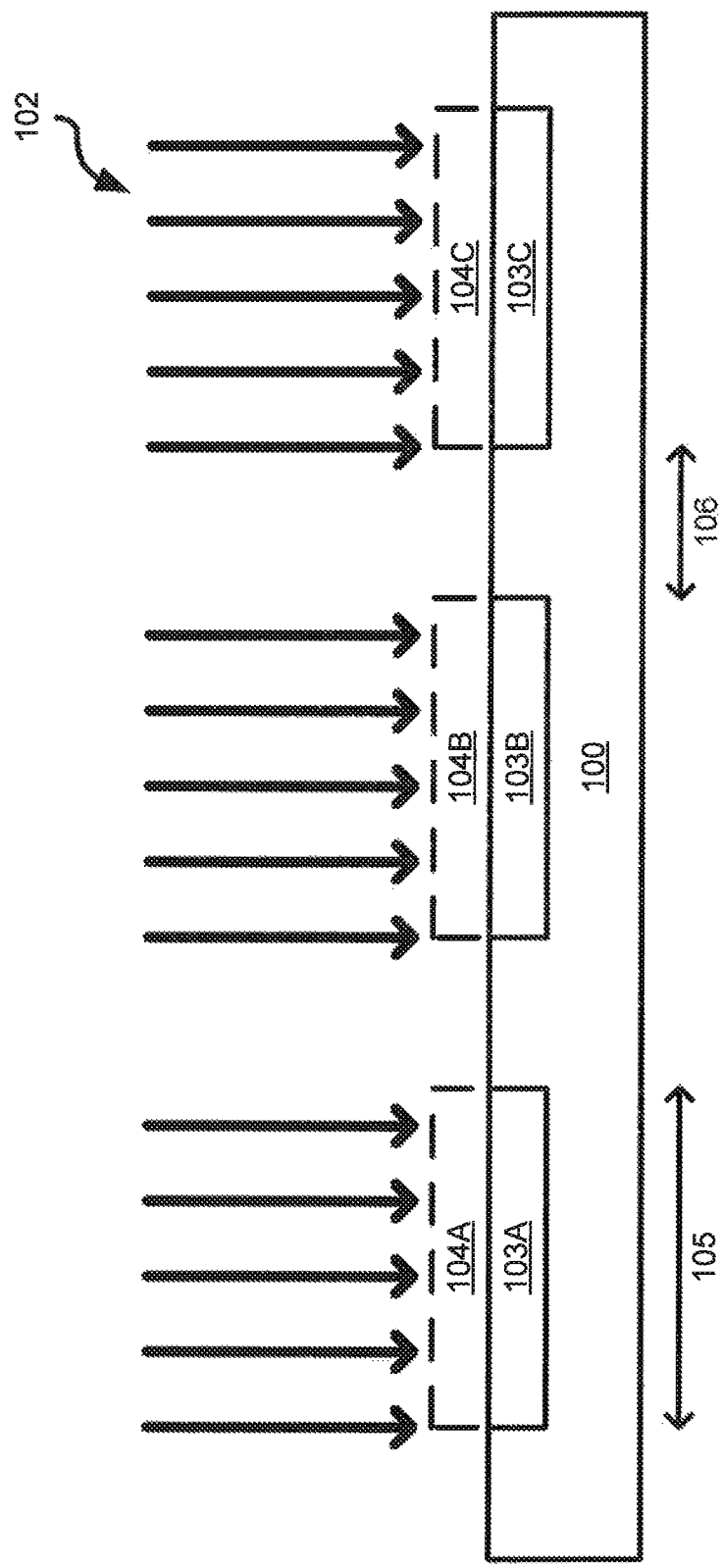
FIG. 2 is a cross-sectional side view of a second embodiment of implantation into a workpiece.

FIG. 2 is a cross-sectional side view of a second embodiment of implantation into a workpiece. In this embodiment, the workpiece 100 is implanted using ions 102 in the implanted regions 103A-103C. Devices 104A-104C are formed on the implanted regions 103A-103C during a later processing step. These devices 104A-104C may have a width 105 of approximately 300 µm and may be separated by a distance 106 of approximately 100 µm, though other dimensions are possible. A plasma processing apparatus having a plasma sheath modifier, such as that illustrated in FIGS. 11-12, or other systems may be used to perform this selective implantation. Thus, parts of the workpiece 100 are not implanted, such as the distance 106 between implanted regions 103A-103C. The implanted regions 103A-103C improve compound semiconductor growth on the workpiece 100 or make the compound semiconductor grow at an increased rate. Some compound semiconductor growth may occur between the implanted regions 103A-103C in one instance, but it may occur at a rate less than the growth on the implanted regions 103A-103C.

Figure 3:
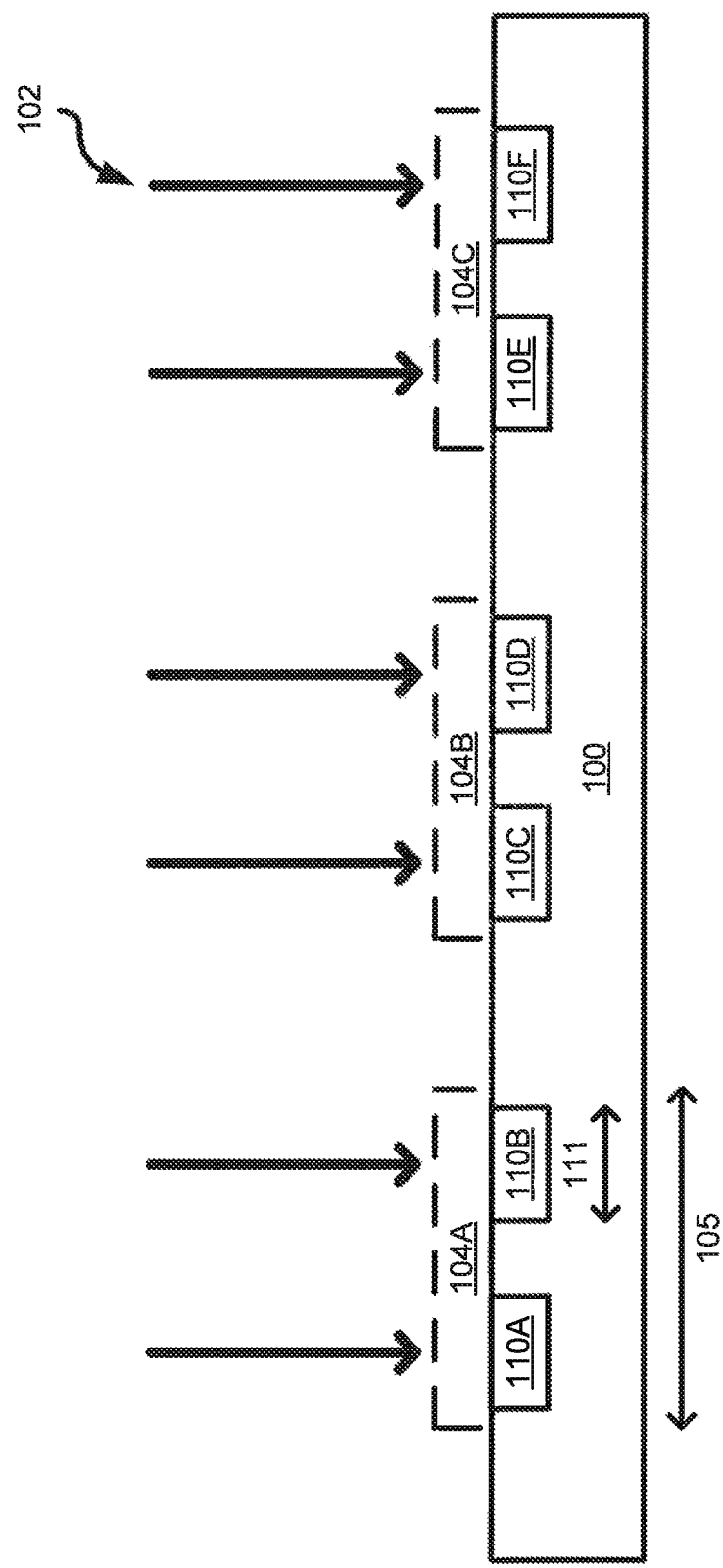
FIG. 3 is a cross-sectional side view of a third embodiment of implantation into a workpiece.

FIG. 3 is a cross-sectional side view of a third embodiment of implantation into a workpiece. In this embodiment, only a portion of the areas under the devices 104A-104C are implanted. The ions 102 only implant the implanted regions 110A-110F. Thus, these implanted regions 110A-110F are smaller than a dimension of the devices 104A-104C. For example, the implanted regions 110A-110F may have a width 111 of approximately 20 µm while the devices 104A-104C may have a width 105 of approximately 300 µm, though other dimensions are possible. Again, a plasma processing apparatus having a plasma sheath modifier, such as that illustrated in FIGS. 11-12, or other systems may be used to perform this selective implantation. Such a selective implantation may improve ELOG and the subsequently-grown compound semiconductor may be of higher quality. This also may enable ELOG within a single device. The implanted regions 110A-110C can improve, reduce, or prevent compound semiconductor growth on the workpiece 100. Thus, the compound semiconductor growth may be at a slower rate over the implanted regions 110A-110C in one instance.

One possible mechanism that reduces or prevents compound semiconductor growth is that the compound semiconductor will preferentially deposit on a crystalline portion of the workpiece 100 compared to an amorphous portion of the workpiece 100. An implant may cause amorphization of the workpiece 100. Another possible mechanism that reduces or prevents compound semiconductor growth relates to using a species that interferes with the nucleation of the compound semiconductor. F, Cl, C, or metals may have this effect. Of course, other mechanisms are possible.

Figure 4:
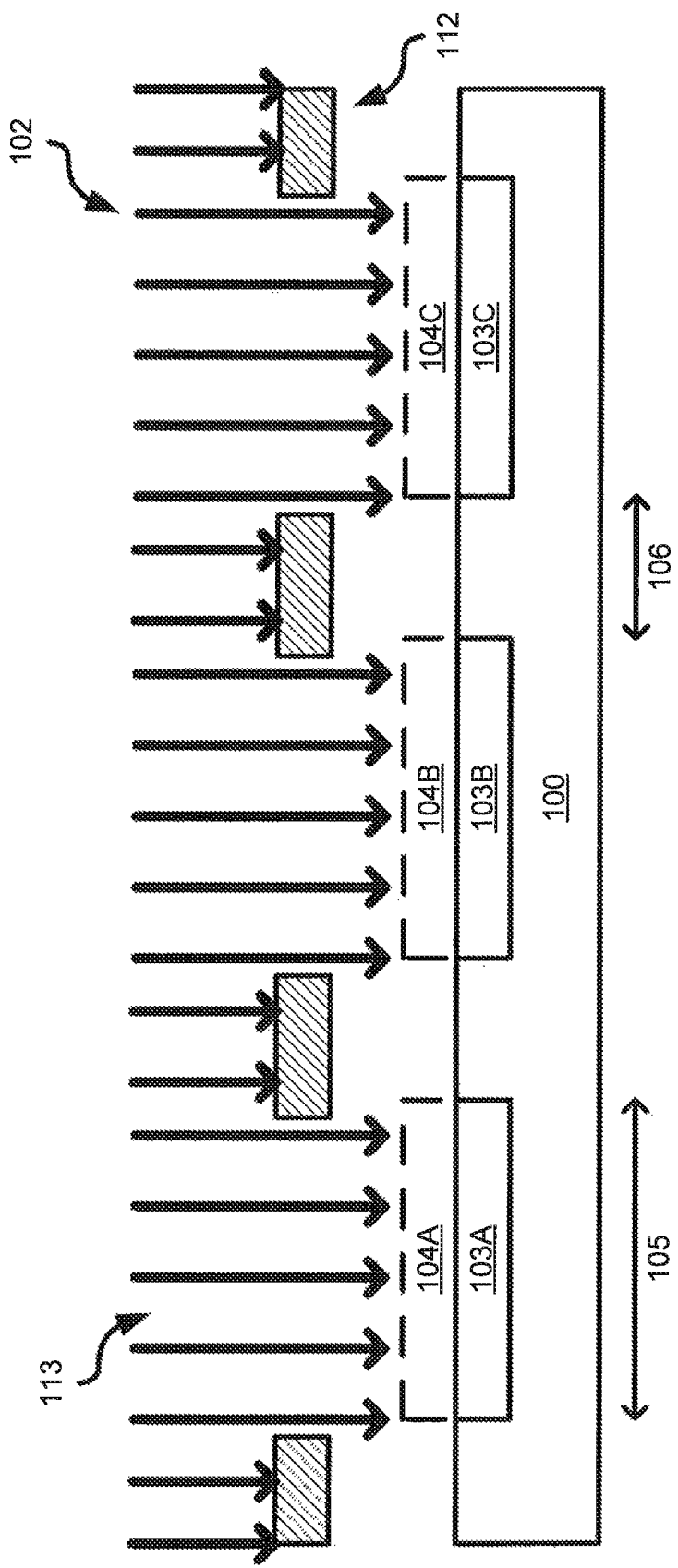
FIG. 4 is a cross-sectional side view of a fourth embodiment of implantation into a workpiece.

FIG. 4 is a cross-sectional side view of a fourth embodiment of implantation into a workpiece. In this embodiment, a blanket implant of the entire workpiece 100 is performed, but a proximity mask 112 positioned above or a distance from the workpiece 100 is used to block a portion of the ions 102. Thus, the apertures 113 in the proximity mask 112 correspond with the desired implanted regions 103A-103C. The devices 104A-104C may have a width 105 of approximately 300 µm and may be separated by a distance 106 of approximately 100 µm, though other dimensions are possible. The distance 106 may not correspond exactly with the dimensions of the proximity mask 112 and the width 105 may not correspond exactly with the dimensions of the aperture 113 due to the angles of the ions 102. The implanted regions 103A-103C may correspond with the location of the devices 104A-104C that are formed during later processing steps. A beamline ion implanter, plasma doping implanter, or other plasma system may be used with the proximity mask 112.

Figure 5:
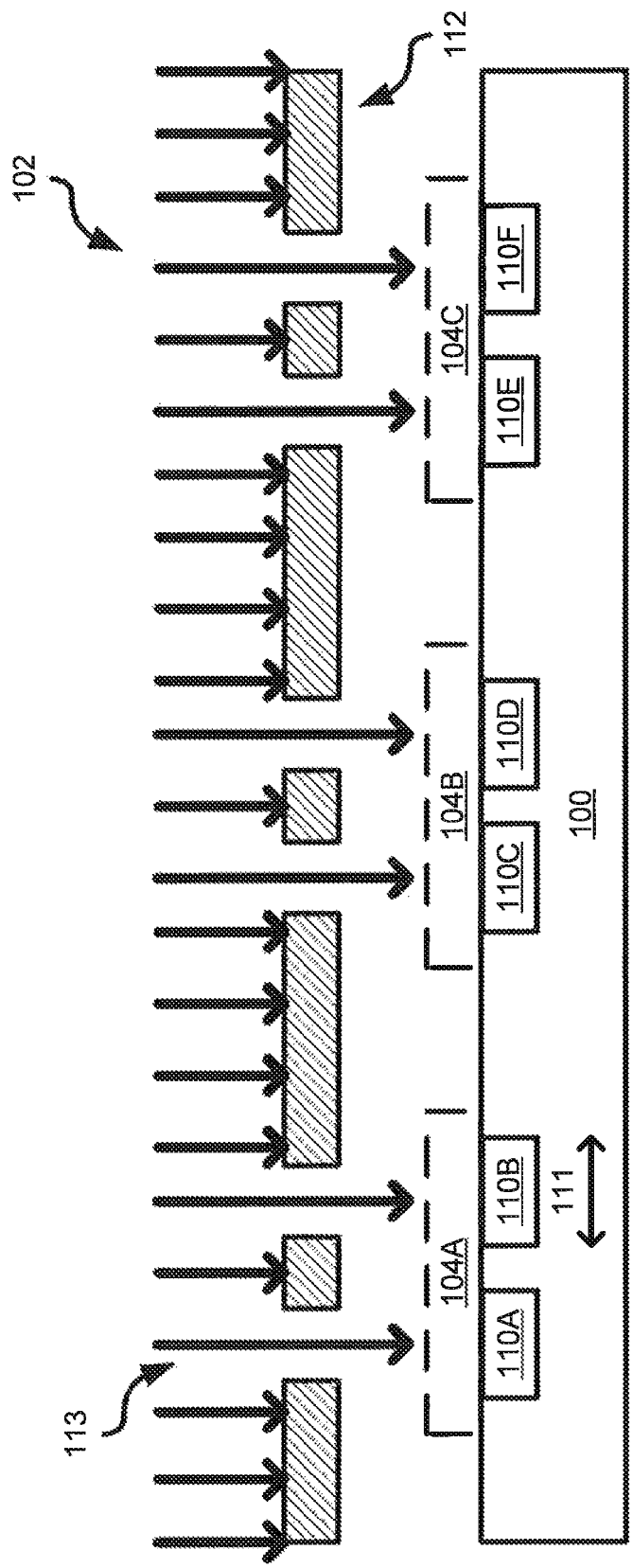
FIG. 5 is a top perspective view of a fifth embodiment of implantation into a workpiece.

FIG. 5 is a cross-sectional side view of a fifth embodiment of implantation into a workpiece. In this embodiment, the apertures 113 in the proximity mask 112 are configured such that the ions 102 implant only a portion of areas under the devices 104A-104C during the blanket implant of the workpiece 100. Thus, these implanted regions 110A-110F are smaller than a dimension of the devices 104A-104C. For example, the implanted regions 110A-110F may have a width 111 of approximately 20 µm while the devices 104A-104C may have a width 105 of approximately 300 µm, though other dimensions are possible. The width 111 may not correspond exactly with the dimensions of the aperture 113 due to the angles of the ions 102. A beamline ion implanter, plasma doping implanter, or other plasma system may be used with the proximity mask.

Figure 6:
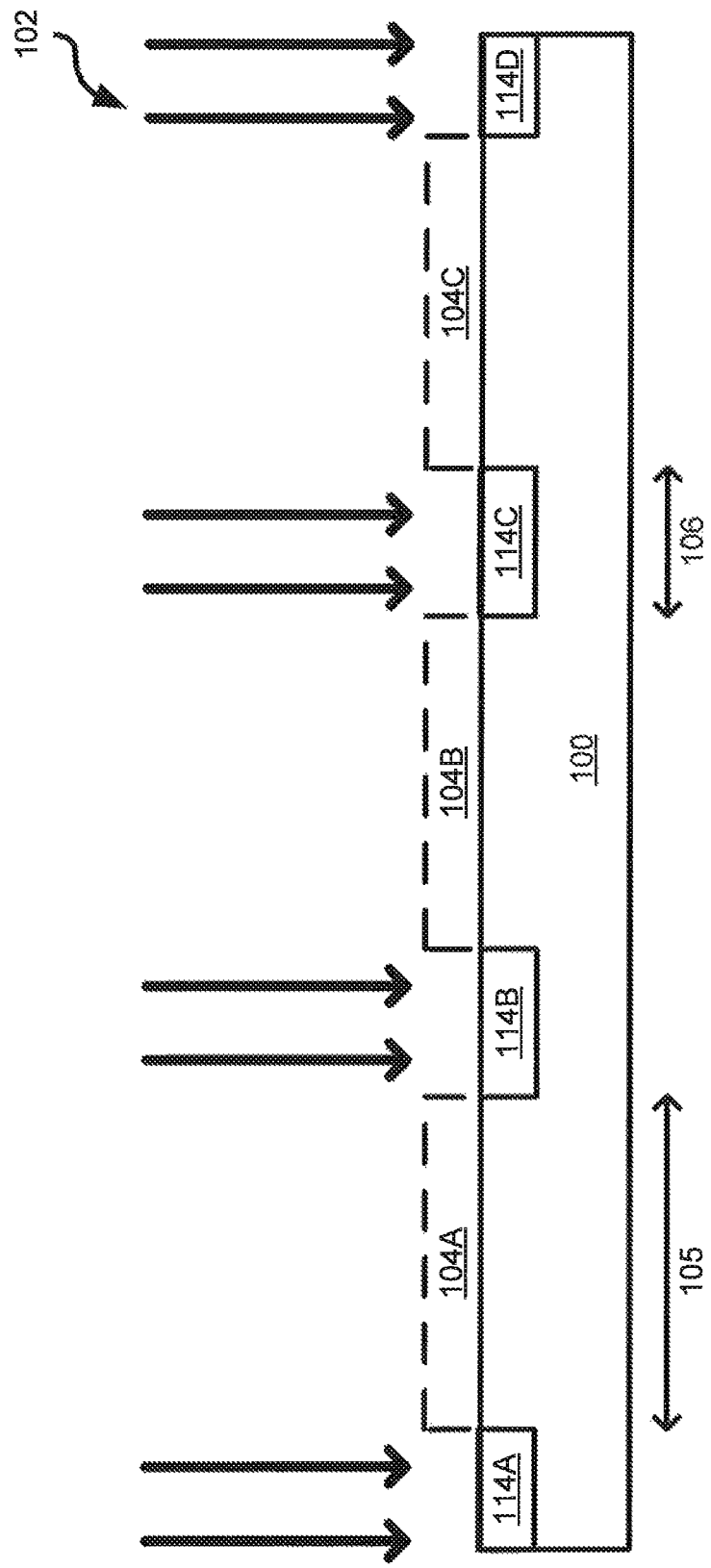
FIG. 6 is a cross-sectional side view of a sixth embodiment of implantation into a workpiece.

FIG. 6 is a cross-sectional side view of a sixth embodiment of implantation into a workpiece. In this embodiment, the regions between the devices 104A-104C are implanted. Thus, the ions 102 form the implanted regions 114A-114D. These implanted regions 114A-114D may prevent or reduce GaN growth between the devices 104A-104C during formation of these devices 104A-104C. While a patterned implant of the ions 102 is illustrated, a proximity mask also may be used. This may be combined with a blanket implant (to increase or reduce GaN growth) or other embodiments disclosed herein. In one embodiment, the compound semiconductor is grown on the surface of the workpiece 100, but this growth may be at a reduced rate over the implanted regions 114A-114D compared to between the implanted regions 114A-114D. In another embodiment, compound semiconductor growth over the implanted regions 114A-114D is prevented but growth between the implanted regions 114A-114D still occurs.

Figure 7:
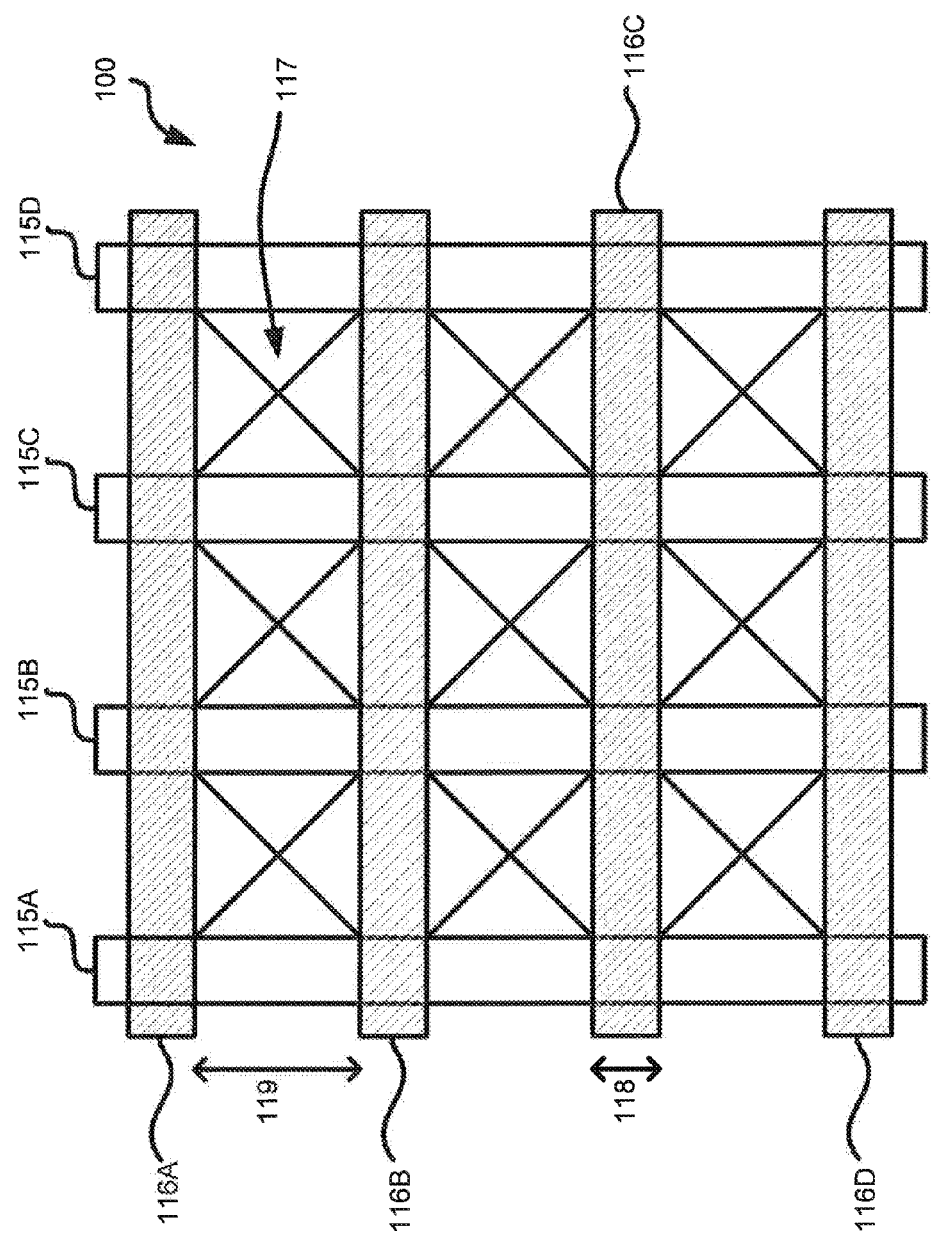
FIG. 7 is a top perspective view of a seventh embodiment of an implanted workpiece.

FIG. 7 is a top perspective view of a seventh embodiment of an implanted workpiece. In this particular embodiment, multiple implant steps are performed. First, a series of lines are implanted in the workpiece to form the implanted regions 115A-115D, which may be similar to the implant illustrated in FIG. 6 that forms the implanted regions 114A-114D. The workpiece 100 is then rotated, for example, 90° and a second series of lines are implanted in the workpiece 100 to form the implanted regions 116A-116D (which are shaded in FIG. 7). Of course, other rotation amounts, such as 60°, are possible. These implanted regions 115A-115D and implanted regions 116A-116D overlap. "Islands" or "blocks" (represented by the spaces 117) that may not be implanted are surrounded by implanted "streets" (represented by the implanted regions 115A-115D and implanted regions 116A-116D). The implanted regions 115A-115D and implanted regions 116A-116D may prevent or reduce growth of the compound semiconductor. During compound semiconductor growth, the crystal regions will meet within such a region 117, as represented by the X within each region 117. While the X is illustrated, there may be variation due to non-uniform deposition and the actual pattern of the crystal regions may vary. The defects are reduced and localized in the compound semiconductor, which leads to a higher quality layer of a compound semiconductor, such as GaN. The spaces 117 may have a dimension 119 of approximately 100 to 500 μm. The implanted regions 115A-115D or implanted regions 116A-116D may have a width 118 of approximately 10 to 100 μm. Of course, other dimensions are possible.

In one particular embodiment, the whole surface of the workpiece 100 is implanted. The implanted regions 115A-115D and implanted regions 116A-116D may be implanted with, for example, Ar and the spaces 117 may be implanted with, for example, N. Other embodiments or combination of species is possible. This may be performed using either two or more patterned implants or using a blanket implant (as illustrated in FIG. 1) to implant the spaces 117 with one or more patterned implant to form the implanted regions 115A-115D and implanted regions 116A-116D. For example, a blanket N implant can be combined with two patterned Ar implants to form the structure shown in FIG. 7. The workpiece 100 is rotated between these two Ar implants.

The quality and growth rate of epitaxially-grown GaN on sapphire can to be controlled by selection of the implant species. For example, N, Al, or O enhance GaN growth on sapphire while Ar prevents or reduces GaN growth on sapphire. Implanting Al, N, or O can change the stoichiometry on the surface of the sapphire workpiece. For example, if GaN is grown on a sapphire workpiece, the N implant will add N to the sapphire workpiece surface. MN may have a better match to GaN than sapphire in terms of lattice constant or size. Implanting Ar may change the stoichiometry by preferential sputtering of Al over the O on the sapphire surface, for example. High doses of some species, such as doses above $1E17\ cm^{-2}$ may prevent or reduce compound semiconductor growth if amorphization occurs on the workpiece. Smaller ions, such as H or He, also may prevent or reduce compound semiconductor growth if amorphization occurs. A dose smaller than $1E17\ cm^{-2}$ may be used to amorphize a workpiece and prevent or reduce compound semiconductor growth with other noble gases larger than Ar.

In one instance, two sapphire workpieces were implanted at 40 keV and $1E17\ cm^{-2}$ using Ar and N, respectively. GaN successively grew on the N-implanted workpiece, while Ar caused pitting in the GaN growth. The dose or either N or Ar may be optimized for improved GaN growth or reduction in growth. For example, an N dose below approximately $1E17\ cm^{-2}$ may improve GaN growth. Of course, other species besides N or Ar may be used. P, As, or other species also may enhance GaN growth. Other noble gases, H, O, Al, C, or other species also may prevent or reduce GaN growth. For silicon workpieces, noble gases such as Ar, Xe, and Kr may prevent growth of GaN. O or N may form $SiO_2$ or SiN regions in a silicon workpiece during an anneal, which also may prevent growth of GaN. These species also may have similar effects on other workpiece materials or with other compound semiconductors.

Compound semiconductor growth, such as GaN growth, on a silicon workpiece also may be enhanced by implanting C or Ge. This may form SiC or SiGe during an anneal. These SiC or SiGe regions modify the lattice parameter of the silicon and may allow better lattice matching to the GaN.

Effects on the surface of the workpiece also may enhance, reduce, or prevent growth of a compound semiconductor. For example, a 0.5 keV Ar implant into a silicon workpiece with a dose of $5E16\ cm^{-2}$ has been shown to sputter approximately 100 nm away from the workpiece. Thus, this is further increased when using a focused beam because the sputter yield may increase as the angle of incidence of the ions increases toward 60 degrees. This may produce a textured workpiece. Besides the chemical effects from the ion implantation, this surface topography modification also may affect the growth of the compound semiconductor. In one instance, the textured surface caused by sputtering will enhance compound semiconductor growth on the workpiece.

Figure 8:
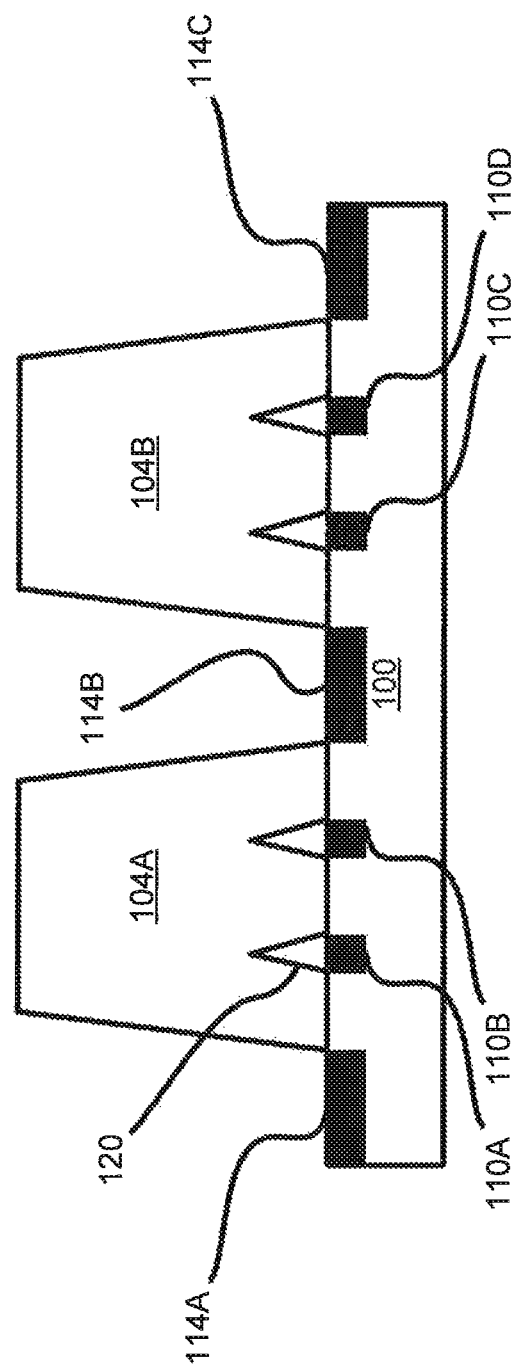
FIG. 8 is a cross-sectional side view of an eighth embodiment of an implanted workpiece.

FIG. 8 is a cross-sectional side view of an eighth embodiment of an implanted workpiece. The workpiece 100, which also may include a blanket buffer layer (not illustrated), is implanted using a proximity mask or patterned implant as previously described. The implanted regions 114A-114C and implanted regions 110A-110D are designed to reduce or prevent GaN growth. These implanted regions 114A-114C and implanted regions 110A-110D may be implanted with Ar. A compound semiconductor, such as GaN, is grown between these implanted areas to form devices 104A and 104B, which may be LEDs. Defect lines or voids 120 form above the implanted regions 110A-110D. These may encourage ELOG to occur within the individual devices 104A and 104B. Selective area growth (SAG) may occur between the devices 104A and 104B.

Figure 9:
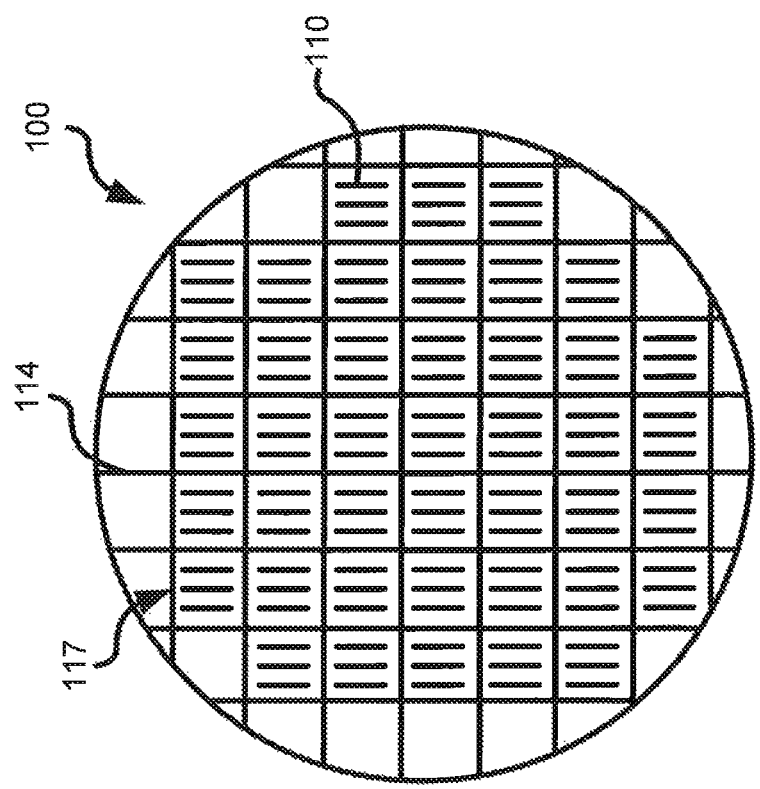
FIG. 9 is a perspective view of a ninth embodiment of an implanted workpiece.

FIG. 9 is a perspective view of a ninth embodiment of an implanted workpiece. This embodiment may correspond to the embodiment illustrated in FIG. 8. The workpiece 100 is implanted. The implanted regions 114, of which only one is pointed out in FIG. 9, separate multiple spaces 117. The compound semiconductor preferentially grows in the spaces 117 between the implanted regions 114 because the implanted regions 114 are configured to reduce or prevent growth of a compound semiconductor. At least one space 117 has at least one implanted regions 110, of which only one is pointed out in FIG. 9. The implanted regions 114 and 110 are configured to reduce or prevent growth of GaN. The spaces 117 may be implanted in one instance to improve growth of GaN. Of course, other implant patterns are possible from that illustrated in FIG. 9.

Figure 10:
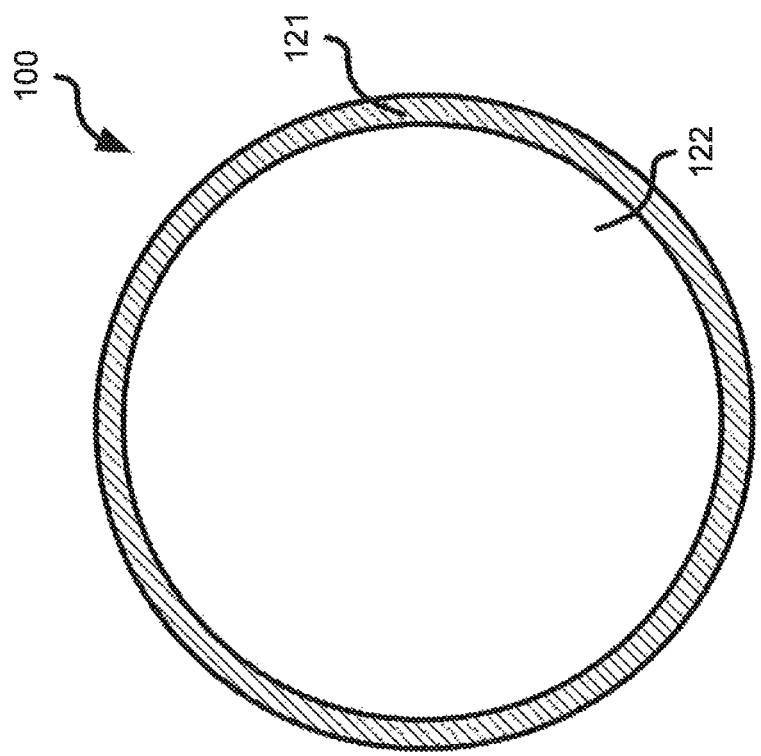
FIG. 10 is a top perspective view of a tenth embodiment of an implanted workpiece.

FIG. 10 is a top perspective view of a tenth embodiment of an implanted workpiece. The periphery 121 (shaded in FIG. 10) of the workpiece 100 is implanted to reduce or prevent compound semiconductor growth. During a growth process, GaN or another compound semiconductor may grow thicker or at a faster rate at this periphery 121 than in the center 122. The lattice constant of, for example, GaN may be smaller than that of the sapphire or silicon in a workpiece 100. Thus, the GaN deposits under significant strain at the center 122 of the workpiece 100. At the periphery 121 of the workpiece 100, the GaN deposits more freely or is less constrained and forms an initial layer more quickly. Once the GaN is deposited, additional Ga and N atoms deposit more freely on the GaN at the periphery 121 of the workpiece 100 than filling the center 122 of the workpiece 100. This forms a thicker outer layer of GaN on the workpiece 100. This effect may disappear when a sufficiently thick layer of GaN, such as greater than approximately 100 nm, is formed on the entire surface of the workpiece 100, but the workpiece 100 may still have an uneven layer of GaN due to the initial GaN growth at the periphery 121.

The resulting thicker GaN at the periphery 121 may lead to cracking because of the increased stresses caused by the difference in thickness. The implant at the periphery 121 is configured to reduce compound semiconductor growth so that this compound semiconductor growth is equal on both the periphery 121 and center 122. This results in a workpiece 100 having a compound semiconductor layer with an approximately equal or uniform thickness. Or, alternatively, the implant at the periphery 121 is configured to totally prevent compound semiconductor growth on the periphery 121. In one particular embodiment, the workpiece 100 is rotated 360° under a fixed ion beam that: has a width of the implanted area at the periphery 121. In one instance, the periphery 121 that is implanted has a width of approximate 5 mm, though other dimensions are possible. This implant into the periphery 121 may be combined with other implants, such as the resulting implanted workpiece 100 of FIG. 9.

In one particular embodiment, the workpieces may have a blanket implant performed across the entire surface of the workpiece prior to the patterned implant. This may be have a different dose, energy, or species from a patterned implant. The blanket implant may improve compound semiconductor growth.

In an alternate embodiment, the compound semiconductor may be grown in a plasma cluster tool. This may be the same tool where the implants were performed or it may be operatively linked to the tool where the implants were performed. Vacuum may not be broken around the workpiece if the tools are operatively linked, which reduces oxide layers, contamination of workpieces, and increases throughput. Ion beam assisted deposition (IBAD) also may assist in GaN growth.

Figure 11:
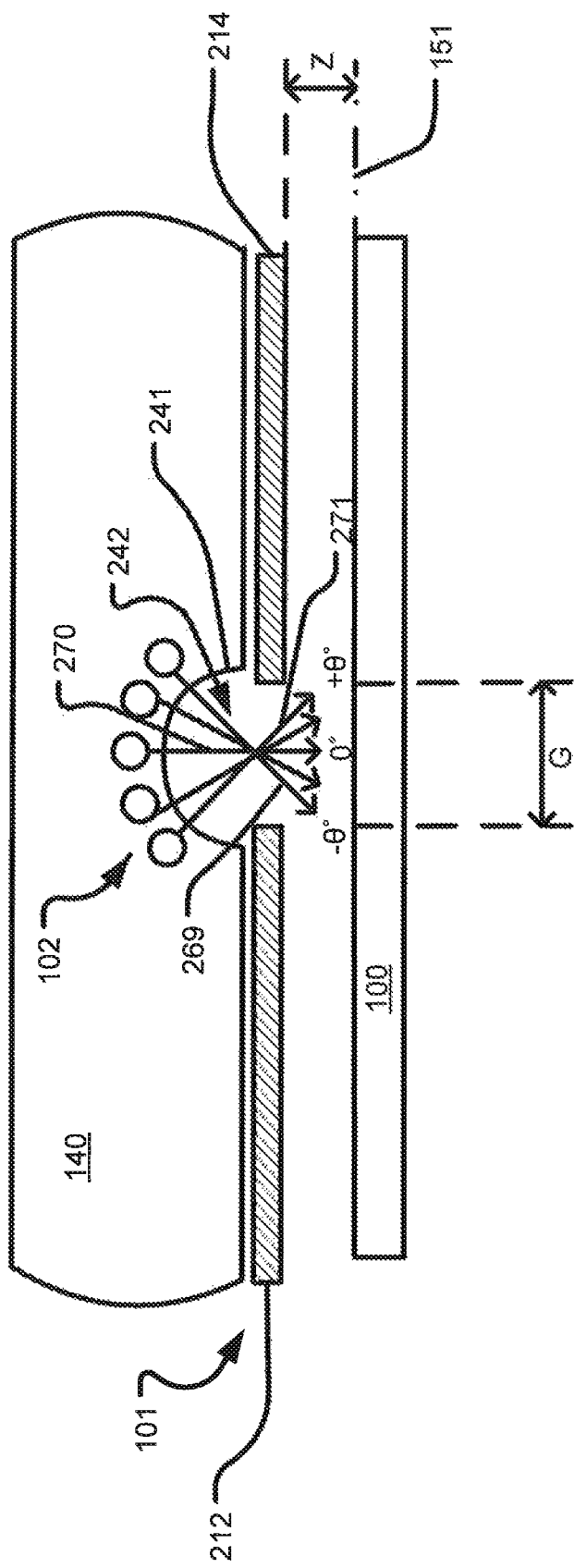
FIG. 11 is a block diagram of a plasma processing apparatus having a plasma sheath modifier.

FIG. 11 is a block diagram of a plasma processing apparatus having a plasma sheath modifier. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 102 from the plasma 140 are attracted toward a workpiece 100. These ions 102 may be attracted with sufficient energy to be implanted into the workpiece 100. The plasma 140 is bounded by a region proximate the workpiece 100 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, few excitation-relaxation collisions occur. Thus, the plasma sheath 242 is sometimes referred to as "dark space."

The plasma sheath modifier 101 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 100 at a large range of incident angles. This plasma sheath modifier 101 may be referred to as, for example, a focusing plate or sheath engineering plate.

In the embodiment of FIG. 11, the plasma sheath modifier 101 includes a pair of panels 212 and 214 defining an aperture there between having a horizontal spacing (G). The panels 212 and 214 may be an insulator, semiconductor, or conductor. In other embodiments, the plasma sheath modifier 101 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture. The panels 212 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the plasma sheath modifier 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the aperture between the panels 212 and 214 at a large range of incident angles. For instance, ions 102 following trajectory path 271 may strike the workpiece 100 at an angle of $\pm\theta°$ relative to the plane 151. Ions 102 following trajectory path 270 may strike the workpiece 100 at about an angle of 0° relative to the same plane 151. Ions 102 following trajectory path 269 may strike the workpiece 100 an angle of $-\theta°$ relative to the plane 151. Accordingly, the range of incident angles may be between $+\theta°$ and $-\theta°$ centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles ($\theta$) may be between +60° and −60° centered about 0°.

Figure 12:
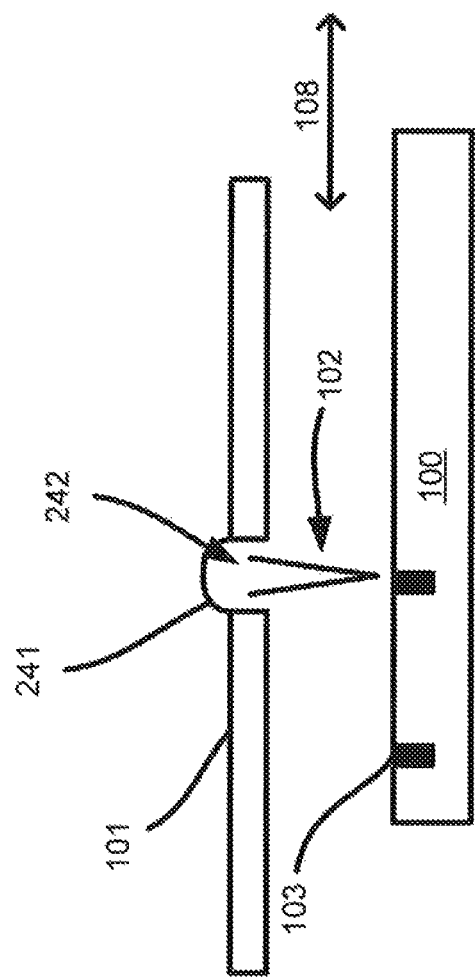
FIG. 12 is a side view of an embodiment of selective ion implantation.

FIG. 12 is a side view of an embodiment of selective ion implantation. Implanted regions 103 are formed in the workpiece 100 using the ions 102. The workpiece 100 is scanned with respect to the plasma sheath modifier 101 or ions 102, as illustrated by the arrow 108. This may involve moving the plasma sheath modifier 101, workpiece 100, or both. The scanning may be in one dimension or two dimensions. In one particular embodiment, the workpiece 100 is biased when the ions 102 implant the implanted regions 103. The bias scheme is adjusted to produce the desired pattern of implanted regions 103. Thus, the workpiece 100 is not biased when the ions 102 would implant between the implanted regions 103. This eliminates or reduces ions 102 from impacting between the implanted regions 103. In this manner, the implanted regions 103 may be formed without a mask or photoresist layer on the workpiece 100. Alignment, lithography, or photoresist removal steps may be eliminated.

The location of the implanted regions 103 may be carefully controlled because spacing of the implanted regions 103 may affect growth of the GaN or another compound semiconductor during ELOG. This spacing may be optimized for the improved compound semiconductor growth.

The dose rate and focus of the ions 102 can be varied to form the implanted regions 103. If the workpiece 100 is scanned, then the ions 102 may be switched on and off to form the implanted regions 103, the dose of the ion 102 may be adjusted to reduce implantation between the implanted regions 103, or the ions 102 may be focused when implanting the implanted regions 103. If the ions 102 are focused when implanting the implanted regions 103, the ions 102 may be less focused over other parts of the workpiece 100, which reduces implantation between the implanted regions 103.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications ions are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of workpiece processing comprising:
    selecting a first species of ion such that said first species reduces a rate of compound semiconductor growth on regions in a workpiece implanted with said first species;
    implanting a first plurality of implanted regions in a workpiece with said first species using a mask disposed above and a distance from said workpiece; and
    growing a compound semiconductor on said workpiece after said implanting,
wherein said rate of compound semiconductor growth is reduced on said first plurality of implanted regions compared to between said first plurality of implanted regions, wherein at least one device comprising said compound semiconductor is formed between said first plurality of implanted regions.

2. The method of claim 1, wherein said first plurality of implanted regions is formed by:
    implanting a first set of implanted regions in a workpiece with said first species using said mask;
    rotating said mask relative to said workpiece after implanting said first set;
    implanting a second set of implanted regions in said workpiece with said first species using said mask,
    wherein said first set of implanted regions and said second set of implanted regions intersect so as to form a grid and said rate of compound semiconductor growth is greater in spaces between said first plurality of implanted regions than on said first plurality of implanted regions.

3. The method of claim 2, further comprising implanting a second plurality of implanted regions in said workpiece, wherein each of said second plurality of implanted regions is in a space created by said first plurality of implanted regions.

4. The method of claim 1, further comprising implanting an outer edge of said workpiece, wherein said rate of compound semiconductor growth is reduced on said outer edge.

5. The method of claim 4, wherein said rate of compound semiconductor growth is reduced to zero on said outer edge.

6. A method of workpiece processing comprising:
    selecting a first species of ion such that said first species increases a rate of compound semiconductor growth on regions in a workpiece implanted with said first species;
    implanting a plurality of implanted regions in a workpiece with said first species using a patterned or selective implant; and
    growing a compound semiconductor on said workpiece after said implanting,
wherein said rate of compound semiconductor growth is increased on said plurality of implanted regions compared to between said plurality of implanted regions.

7. The method of claim 6, wherein further comprising implanting a second plurality of implanted regions in said workpiece, wherein each of said plurality of implanted regions is between said second plurality of implanted regions.

8. The method of claim 7, wherein said second plurality of implanted regions form a grid and said rate of compound semiconductor growth is greater on said plurality of implanted regions between said second plurality of implanted regions.

9. The method of claim 6, wherein said implanting textures a surface of said workpiece on said plurality of implanted regions.

10. A method of workpiece processing comprising:
    selecting a first species of ion such that said first species reduces a rate of compound semiconductor growth on regions in a workpiece implanted with said first species, wherein said workpiece comprises an outer edge defined along an entire perimeter of said workpiece;
    implanting said outer edge of a workpiece with said first species; and
    growing a compound semiconductor on said workpiece after said implanting,
    wherein said rate of compound semiconductor growth is reduced on said outer edge.

11. The method of claim 10, wherein said rate of compound semiconductor growth is reduced to zero on said outer edge.

12. The method of claim 10, wherein said rate of compound semiconductor growth on said outer edge is reduced to be approximately equal to a rate of compound semiconductor growth at a center of said workpiece whereby a thickness of said compound semiconductor is approximately equal across said workpiece.

13. The method of claim 10, wherein said implanting comprises rotating said workpiece with respect to an ion beam during said implanting, whereby said ion beam only implants said outer edge.

14. The method of claim 10, wherein further comprising implanting a first plurality of regions in said workpiece, wherein said rate of compound semiconductor growth is reduced on said first plurality of implanted regions compared to between said first plurality of implanted regions.

15. The method of claim 14, wherein said first plurality of regions form a grid and said rate of compound semiconductor growth is greater in spaces between said first plurality of regions than on said first plurality of regions.

16. The method of claim 14, further comprising implanting a second plurality of regions in said workpiece, wherein each of said second plurality of regions is in a space created by said first plurality of regions.

17. The method of claim 1, wherein said first species is selected from the group consisting of noble gases, hydrogen and helium.

18. The method of claim 6, wherein said first species is selected from the group consisting of carbon and germanium, and said workpiece is silicon.

19. The method of claim 2, wherein the first set of implanted regions and the second set of implanted regions are perpendicular to one another.

\* \* \* \* \*